United States Patent
Moreels et al.

(10) Patent No.: US 9,762,033 B2
(45) Date of Patent: Sep. 12, 2017

(54) CONTINUOUS-WAVE PUMPED COLLOIDAL NANOCRYSTAL LASER

(71) Applicant: FONDAZIONE ISTITUTO ITALIANO DI TECNOLOGIA, Genoa (IT)

(72) Inventors: Iwan Philemon Wilhelmus Remy Roger Moreels, Genoa (IT); Joel Quedar Ge Tian Chi Grim, Genoa (IT); Sotirios Christodoulou, Chalandri (GR); Francesco Di Stasio, Genoa (IT); Roman Mark Krahne, Genoa (IT); Liberato Manna, Genoa (IT); Roberto Cingolani, Ceranesi (IT)

(73) Assignee: FONDAZIONE INSTITUTO ITALIANO DI TECHNOLOGIA, Genoa (IT)

( * ) Notice: Subject to any disclaimer, the term of this patent is extended or adjusted under 35 U.S.C. 154(b) by 0 days.

(21) Appl. No.: 15/312,219

(22) PCT Filed: May 29, 2015

(86) PCT No.: PCT/IB2015/054053
§ 371 (c)(1),
(2) Date: Nov. 18, 2016

(87) PCT Pub. No.: WO2015/186033
PCT Pub. Date: Dec. 10, 2015

(65) Prior Publication Data
US 2017/0085058 A1    Mar. 23, 2017

(30) Foreign Application Priority Data

Jun. 3, 2014   (IT) .............. TO2014A0443

(51) Int. Cl.
H01S 3/20        (2006.01)
H01S 5/347       (2006.01)
(Continued)

(52) U.S. Cl.
CPC .............. *H01S 5/347* (2013.01); *H01S 3/169* (2013.01); *H01S 5/041* (2013.01); *H01S 5/105* (2013.01);
(Continued)

(58) Field of Classification Search
CPC ........ H01S 5/1067; H01S 5/105; H01S 5/041; H01S 5/341; H01S 5/347; H01S 5/125; H01S 3/169
See application file for complete search history.

(56) References Cited

U.S. PATENT DOCUMENTS 7,515,333 B1    4/2009 Empedocles
2007/0063208 A1*  3/2007 Klimov ................ B82Y 20/00
                                                       257/97
(Continued)

OTHER PUBLICATIONS

International Search Report for PCT/IB2015/054053 dated Oct. 20, 2015.
(Continued)

*Primary Examiner* — Kinam Park
(74) *Attorney, Agent, or Firm* — Thomas Horstemeyer, LLP

(57) ABSTRACT

Laser device characterized in that it comprises, as gain medium, a film of colloidal nanocrystals of semiconductor material, wherein said nanocrystals are two-dimensional nanocrystals suitable for forming quantum wells for confinement of the charge carriers in the nanocrystals and having a biexciton gain mechanism.

8 Claims, 3 Drawing Sheets

Figure 1:
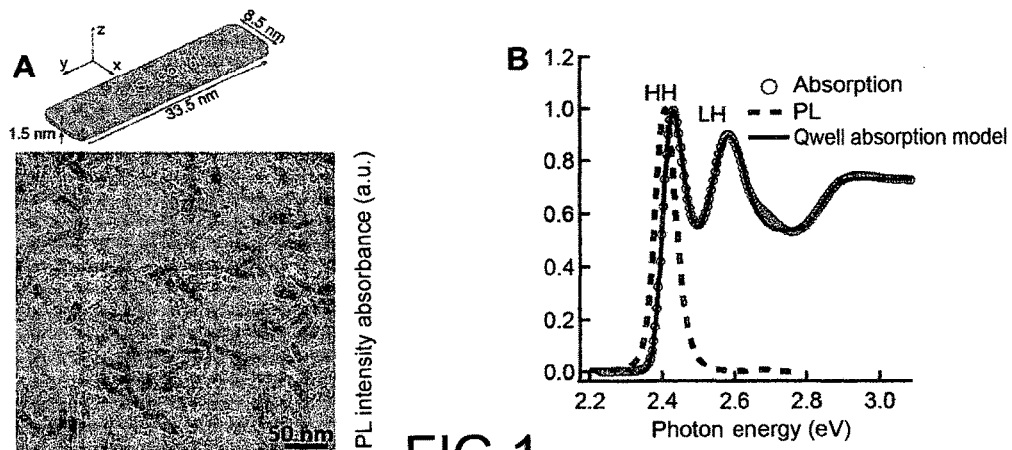

(51) Int. Cl.
H01S 5/10 (2006.01)
H01S 3/16 (2006.01)
H01S 5/125 (2006.01)
H01S 5/34 (2006.01)
H01S 5/04 (2006.01)
B82Y 20/00 (2011.01)

(52) U.S. Cl.
CPC ............ H01S 5/1067 (2013.01); H01S 5/125 (2013.01); H01S 5/341 (2013.01); B82Y 20/00 (2013.01)

(56) References Cited

U.S. PATENT DOCUMENTS

| | | | |
|---|---|---|---|
| 2008/0089367 A1* | 4/2008 | Srinivasan | B82Y 20/00 372/19 |
| 2012/0175567 A1 | 7/2012 | Peng et al. | |
| 2012/0201265 A1 | 8/2012 | Krahne et al. | |
| 2016/0156147 A1* | 6/2016 | Raino | H01S 3/0637 359/341.3 |

OTHER PUBLICATIONS

Grivas, C. & Pollnau, M. Organic solid-state integrated amplifiers and lasers. Laser Photon. Rev. 6, 419-462 (2012).

Clark, J. & Lanzani, G. Organic photonic for communications. Nat. Photonics 4, 438-446 (2010).

Klimov, V. I. Optical Gain and Stimulated Emission in Nanocrystal Quantum Dots. Science (80-. ). 290, 314-317(2000).

Dang, C. et al. Red, green and blue lasing enabled by single-exciton gain in colloidal quantum dot films. Nat. Nanotechnol. 7, 335-9 (2012).

Grivas, C, et al. Single-mode tunable laser emission in the single-exciton regime from colloidal nanocrystals. Nat. Commun. 4, 2376 (2013).

Klimov, V. I. Quantization of Multiparticle Auger Rates in Semiconductor Quantum Dots. Science (80-. ). 287, 1011-1013 (2000).

García-Santamaría, F. et al. Suppressed auger recombination in "giants" nanocrystals boosts optical gain performance. Nano Lett. 9, 3482-8 (2009).

Zavelani-Rossi, M. et al. Suppression of biexciton auger recombination in CdSe/CdS dot/rods: role of the electronic structure in the carrier dynamics. Nano Lett. 10, 3142-50 (2010).

Moreels, I. et al. Nearly temperature-independent threshold for amplified spontaneous emission in colloidal CdSe/CdS quantum dot-in-rods. Adv. Mater. 24, OP231-5 (2012).

Climente, J. I. et al. Auger recombination suppression in nano crystals with asymmetric electron-hole confinement. Small 8, 754-9 (2012).

Bae, W. K. et al. Controlled alloying of the core-shell interface in CdSe/CdS quantum dots for suppression of Auger recombination. ACS Nano 7, 3411-9 (2013).

Achtstein, A. W. et al. Electronic structure and exciton-phonon interaction in two-dimensional colloidal CdSe nanosheets. Nano Lett. 12, 3151-7 (2012).

Ithurria, S. et al. Colloidal nanoplatelets with two-dimensional electronic structure. Nat. Mater. 10, 936-41 (2011).

Voigt, J. et al. Band parameters of CdS and CdSe single crystals determined from optical exciton spectra. Phys. Status Solidi 91, 189-199 (1979).

Woggon, U. et al. Huge binding energy of localized biexcitons in CdS/ZnS quantum structures. Phys. Rev. B 61, 12632-12635 (2000).

Kim, J. et al. Thermodynamics of biexcitons in a GaAs quantum well. Phys. Rev. B 50, 15099-15107 (1994).

Kunneman, L. T. et al. Bimolecular Auger Recmobination of Electron-Hole Pairs in Two-Dimensional CdSe and CdSe/CdZnS Core/Shell Nanoplatelets. J. Phys. Chem. Lett. 4, 3574-3578 (2013).

Homburg, O. et al. Biexcitonic gain characteristics in ZnSe-based lasers with binary wells. Phys. Rev. B 60, 5743-5750(1999).

Malko, A. V. et al. From amplified spontaneous emission to microring lasing using nanocrystal quantum dot solids. Appl. Phys. Lett. 81, 1303 (2002).

Chénais, B. et al. Recent advances in solid-state organic lasers. Polym. Int. 61, 390-406 (2012).

Mahler, B. et al. Core/shell colloidal semiconductor nanoplatelets. J. Am. Chem. Soc. 134, 18591-8 (2012).

* cited by examiner

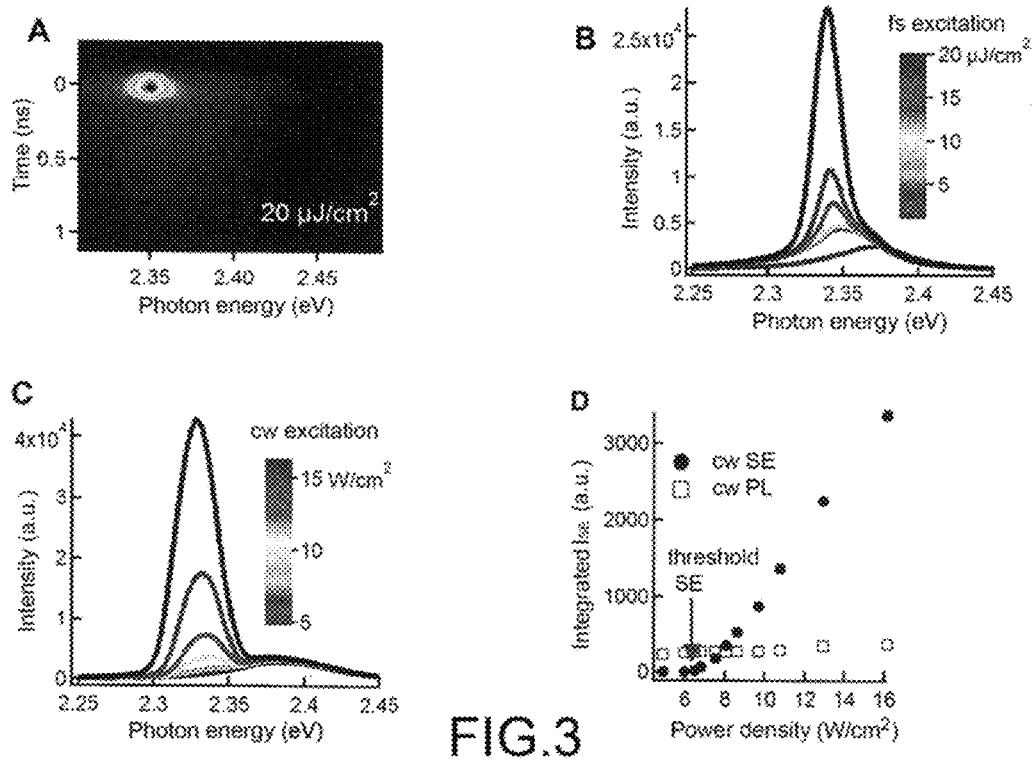
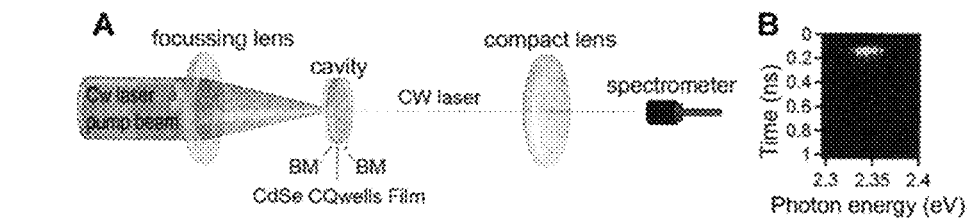
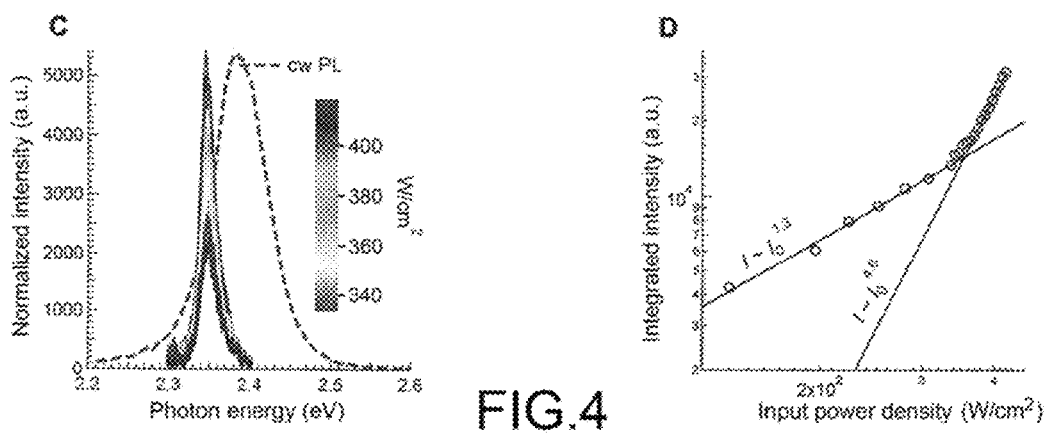
FIG. 4

CONTINUOUS-WAVE PUMPED COLLOIDAL NANOCRYSTAL LASER

CROSS-REFERENCE TO RELATED APPLICATION

This application is the 35 U.S.C. §371 national stage application of PCT Application No. PCT/IB2015/054053, filed May 29, 2015, where the PCT claims priority to and the benefit of, IT Patent Application No. TO2014A000443, filed Jun. 3, 2014, both of which are herein incorporated by reference in their entirety.

The present invention relates in general to continuous-wave laser devices.

The production of continuous wave (cw) laser light from room-temperature semiconductors was first demonstrated in a double heterostructure laser more than 40 years ago. Since then solid-state cw lasers of varying wavelength have been developed. The common feature of these devices is that they are manufactured using complex micro-manufacturing techniques which typically require high vacuum and temperature levels.

Solution-processed lasers offer the prospect of manufacture using low-cost methods producing broad surfaces such as spray-coating or ink-jet printing; however cw operation in this connection has not yet been demonstrated.

In organic electronics a laser effect with nanosecond pulsed pumping has already been obtained, but the stimulated emission (SE) is eventually extinguished by the accumulation of triplet states and the simultaneous singlet-triplet annihilation [1, 2]. The long-term operation is also negatively affected by degradation of the sample [1], and the production of lasers with electric pumping is still considered to be a major challenge [1, 2]. Inorganic colloidal nanocrystals (NCs) constitute an alternative potential material [3, 4, 5]. However, initially the development of these materials was hindered by an intense Auger recombination (AR) which prevented the occurrence of lasting population inversion [4, 6].

The AR rates in the NCs are inversely proportional to the exciton volume and overlapping of the electron and hole wave functions and are therefore suppressed in the NC heterostructures which allow delocalization of the electrons [7, 8]. Consequently, SE has already been demonstrated in giant shell colloidal quantum dots (CQdots) [7] and colloidal CdSe/CdS based dot-in-rods; in particular in this latter case a temperature-independent SE threshold has been observed, this being a typical characteristic of Qdot laser generation. The electron delocalization, however, is at the cost of a reduced oscillator strength of the band limit transition. Dang et al. [4] have shown that, with type I core/shell NCs based on $CdSe/Cd_{0.5}Zn_{0.5}S$, an exceptionally high photoluminescence quantum efficiency, higher than 80%, in a highly concentrated NC solution, and a high Stokes displacement of about 20 nm are also sufficient conditions for obtaining low threshold gain and single exciton laser effect. This result has certainly been facilitated by the use of NCs with a gradual core/shell interface since a more regular confinement potential reduces the high-order moment components in the wave function of the ground state and this, as is known, reduces the AR [10, 11].

One object of the present invention is to provide a solution-processed laser device able to eliminate, or at least reduce, the drawbacks of the prior art.

Another object of the invention is to provide a solution-processed laser device able to operate in continuous wave mode.

These and other objects are achieved according to the invention by a laser device comprising, as a gain medium, a film of colloidal nanocrystals of semiconductor material, wherein said nanocrystals are two-dimensional nanocrystals suitable for forming quantum wells for confinement of the charge carriers in the nanocrystals and having a biexciton gain mechanism, and wherein said nanocrystals are adapted to provide strong confinement of the charge carriers in a thickness direction of the nanocrystal and weak or no confinement of the charge carriers in each of two mutually orthogonal lateral directions of the nanocrystal, orthogonal to the thickness direction.

Any semiconductor material may be used to provide the colloidal quantum wells, provided that the characteristics indicated above are present. In this connection, typical semiconductors which may be used are CdSe, CdS, CdTe, PbSe, ZnSe and PbS and their core/shell structures. More generally, the semiconductor may be selected from the group consisting of selenides, sulphides and tellurides of element of groups I, II, III, IV and V, and their core/shell structures, optionally containing atomic dopants in a concentration of less than 10%.

While the thickness of the nanocrystals (or, in the case of nanocrystals with a core/shell structure, the thickness of the core part of the nanocrystal) must be at the most a few nanometres in order to ensure the strong confinement of the charge carriers in the thickness direction, the lateral dimensions of the nanocrystals are significantly larger and may vary from dimensions of the order of nanometres to tens of nanometres with dimensions of the order of micrometres.

With the two-dimensional colloidal nanocrystal gain medium according to the invention it is possible to obtain high radiative decay rates owing to the strong confinement of the charge carriers, with a simultaneous high volume of excitonic coherence. In colloidal quantum wells (CQwells) the confinement of the charge carriers is determined by the thickness of the QCwells, while the larger-size lateral dimensions determine an exciton volume which allows coherent phase-shift of the dipoles in a large number of unitary cells. This results in a dipole matrix element greater than that which can be obtained for a single atom, directly increasing the spontaneous emission rates so as to offset the effects of non-radiative recombination.

In particular, it is possible to obtain a laser emission in the transparency region of the colloidal gain medium, i.e. outside of the absorption bands of the ground state and the excited state. This because the stimulated emission—and therefore the laser emission—of the CQwells originates from the biexciton population with a strong shift towards red. This displacement reduces the laser threshold at the biexciton generation threshold. Owing to their high bond energy in the CQwells, the biexcitons are stable at room temperature. Laser biexciton generation moreover constitutes a laser generation system consisting of four levels; the usual requisite of having at least a 50% population inversion is not necessary and, once the biexcitons have been created, it is possible to obtain optical gain and laser effect.

Figure 2:
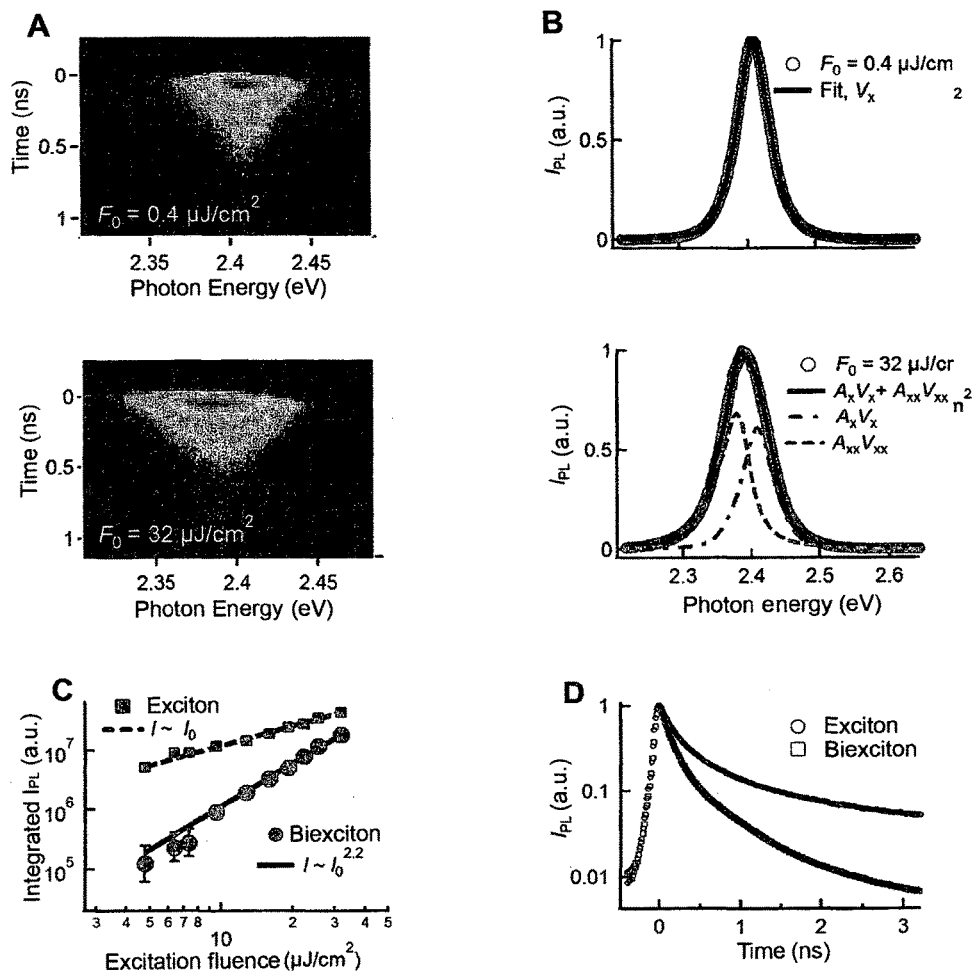
Figure 5:
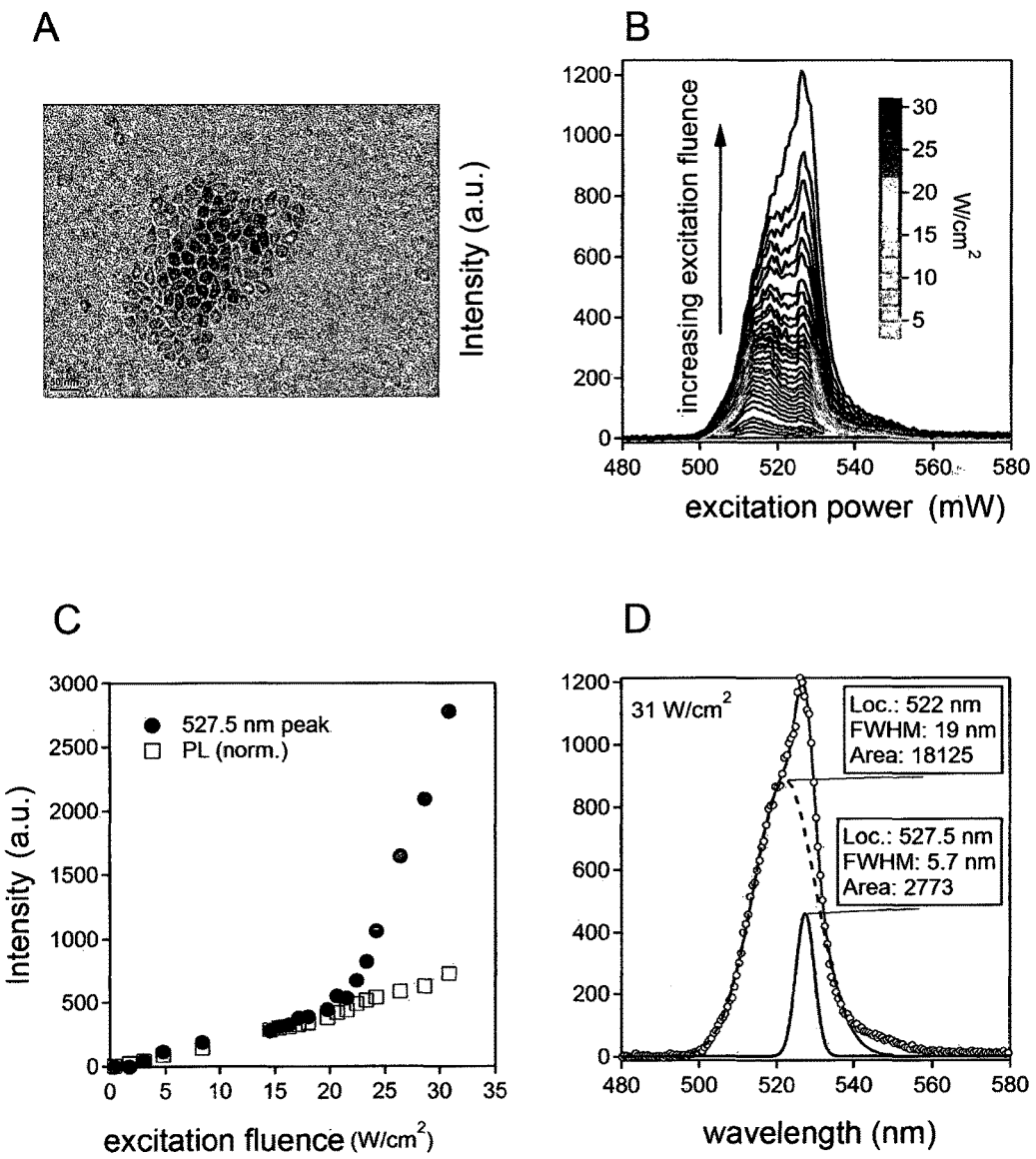

It is possible to insert the gain medium in a resonant cavity by depositing, in particular by means of drop casting, a concentrated solution of colloidal CQwells onto a reflector, in particular a Bragg mirror (BM), so as to form a film. A second reflector, in particular a BM, is positioned above to form the cavity. The reflectors are chosen so as to have a photonic gap overlapping the laser emission. Clearly, the resonant cavity must not be necessarily formed by Bragg mirrors, be may be any one of the known structures conventionally used as cavities, such as Fabry-Perot cavity structures, distributed Bragg mirrors, micro-rings, microspheres, micro-discs, VCSEL structures and the like. Further characteristic features and advantages of the laser according to the invention will become clear from the following detailed description of an embodiment of the invention, provided with reference to the accompanying drawings which are provided purely by way of a non-limiting example and in which:

FIG. 1 shows: (A) An electron microscope image of CdSe CQwells transmission. The average lateral dimensions are 8.5 nm×35.3 nm. The drawing also shows the thickness of 1.5 nm [12]. (B) Absorption spectra (circles) and photoluminescence (broken lines) of CdSe CQwells. The absorption data is approximated with a quantum well absorption model (continuous line) which provides an exciton bond energy of 132 meV;

FIG. 2 shows: (A) Streak camera images of CdSe CQwells excited with laser pulses having a frequency of 1 kHz and duration of 70 femtoseconds (fs) which show low fluence emission (top image) and high fluence emission (bottom image). (B) The spectrum integrated over time (first nanosecond) for a fluence of 0.4 µJ/cm$^2$ shows a single symmetrical peak. With a fluence of 32 µJ/cm$^2$ the spectrum contains two components, i.e. $A_xV_x$ and $A_{xx}V_{xx}$. (C) Their integrated intensities confirm that the peak displaced towards red is due to the biexciton emission. (D) Spectrally integrated decay paths from which it is possible to deduce exciton and biexciton average lifetimes of 438 ps and 124 ps, respectively;

FIG. 3 shows: (A) Streak camera images which show narrow-band fast SE with fs excitation. The spectrum and time ranges are the same as in FIG. 2A so as to facilitate a visual comparison. (B) Dependency of the excitation fluence of the SE with fs excitation. The low intensity single exciton photoluminescence is converted firstly into biexciton emission, followed by thinning of the gain and SE also with greater fluences. (C) Similar spectra are obtained with cw excitation, but without observation of a clear biexciton photoluminescence peak. (D) The graph of the intensity for a cw excitation shows a threshold at 6.5 W/cm$^2$ for the SE peak and a saturation for the residual photoluminescence;

FIG. 4 shows a continuous-wave laser with cavity based on CQwells at room temperature: (A) Diagram of the laser cavity. With identical BMs reflecting 99.5% of the emission at 530 nm. (B) Pulsed fs measurements produce the same laser peak as with cw pumping and confirm the expected ultrarapid response of the emission peak. (C) Formation of a cw pumped laser peak centred at 2.34 eV (530 nm) and a photoluminescence spectrum of a thin film is shown for comparison purposes. (D) The integrated emission intensity increases linearly below the laser threshold, while it increases superlinearly (with power law of 4.6) above the threshold; and FIG. 5 shows: (A) An electron microscope image for transmission of a second example of CdSe CQwells. (B) Dependency on the excitation fluence of the stimulated emission of the CQwells of FIG. 5A with continuous-wave excitation. (C) Superlinear increase of the integrated intensity of the narrow stimulated emission peak. (D) Fitting of the spectrum, used to extract the integrated intensity.

The present invention arises from the finding that with two-dimensional nanocrystals, i.e. colloidal quantum wells, it is possible to obtain results comparable with engineered heterostructures which suppress the Auger recombination or achieve a single-exciton gain. In two-dimensional NCs the energy levels are quantified only in one direction, requiring a law for conservation of the angular moment owing to AR which is narrower than for the zero-dimensional colloidal quantum dots. When using CdSe CQwells with green emission, the inventors have in effect noticed an efficient emission at room temperature, with an average lifetime consistent with a strong AR suppression. As will become clear below, it has thus been possible to obtain gain in thin CQwell films using only 6 µJ/cm$^2$ of excitation fluence in pulsed regime as well as stimulated efficiency and laser effect at 530 nm with continuous-wave optical pumping.

During synthesis it is possible to perform a check at atomic level of the thickness of the CQwells, with the consequent creation of symmetrical and narrow emission bands which may be adjusted to discrete levels from blue (460 nm) to green (515 nm) and to yellow (550 nm) [13]. In particular, the synthesis of CQwells has been optimized in order to obtain samples with a typical photoluminescence (PL) quantum efficiency of 25% in solution.

By way of example, reference is made hereinbelow to a process used to obtain the samples which formed the subject of the measurements described below. 170 mg of Cd-myristate, 24 mg of Se and 15 ml of octadecene were introduced into a three-necked flask and degassed under a vacuum for 30 minutes at 100° C. In an argon atmosphere the temperature was increased to 210° C. and, once this temperature was reached, 90 mg of hydrated Cd-acetate (Cd(Ac)$_2$.4H$_2$O) was rapidly injected. The mixture was further heated to 240° C. and kept at this temperature for 10 minutes. The CQwells solution thus obtained also contained a fraction of spherical aggregates which were separated from the CQwells by means of selective precipitation.

Measurements of the PL quantum efficiency, the photoluminescence excitation (PLE) spectra and the stationary-state PL were carried out using a spectrofluorometer. The samples were excited with a 450 W xenon lamp. The CdSe CQwells were dispersed in 3 ml of toluene with an optical density of 0.1 to 400 nm using a quartz cuvette with a 10 mm optical path.

Time-resolved PL measurements were carried out with a picosecond time resolution using a streak camera. The samples were deposited by means of drop casting on a sapphire substrate both for room-temperature measurements and for low-temperature measurements. The samples were excited with an amplified Ti:sapphire laser at 400 nm with 70 fs pulses at a repetition frequency of 1 kHz or with a continuous-wave laser at 405 nm. For the 4 K PL spectroscopy measurements, the samples were cooled using a closed-cycle helium cryostat.

FIG. 1A shows an electron microscope image for transmission of the CQwells. The PL peak at 2.41 eV (FIG. 1B) corresponds to a thickness of 1.5 nm equivalent to 5 monolayers (ML) of CdSe according to Achtstein et al. [12]. The CQwells were measured as having average lateral dimensions of 8.5 by 35.3 nm; these lateral dimensions imply that the excitons undergo strong confinement only in the direction z (thickness). The emission and absorption spectra in FIG. 1B reveal a Stokes displacement of 24 meV. Also visible in the figure are the exciton transitions associated with the heavy holes (HH) and the light holes (LH), at 2.43 eV and 2.57 eV respectively. By fitting onto the spectrum a quantum well absorption model an exciton bond energy $E_b^x$ of 132±20 meV was determined, this tallying with an $E_b^x$ of 130-175 meV calculated for 5 ml of CdSe CQwells with lateral dimensions of 20 nm (assuming a dielectric constant of 2-3 for the ligands [12]. This high value may be correlated with exceptionally strong confinement of the two-dimensional exciton in the 1.5 nm thick CQwell. Since the increase by a factor 4 expected for the two-dimensional excitons is exceeded (the bulk value of $E_b^x$ for CdSe is equal to 15 meV) [14], the excitons also undergo a weak confinement in the lateral dimensions, due to the finite dimensions of the CQwell or small fluctuations in potential of the well.

Detailed measurements of the biexciton emission and the associated Auger recombination were carried out on tightly packed thin films which were obtained by depositing by means of drop casting the CQwells from toluene on a sapphire substrate. The top and bottom frames in FIG. 2A show a spectrally symmetrical PL for an excitation $F_0=0.4$ μJ/cm$^2$, and a widened spectrum for $F_0=32$ μJ/cm$^2$. The spectra shown in FIG. 2B were obtained by temporally integrating the streak images of FIG. 2A over the first nanosecond. These spectra are fitted by a pseudo-Voigt function with line form $V_x$ for the low fluence spectrum and by a sum of two Voigt functions $V=A_x V_x + A_{xx} V_{xx}$ for the high fluence spectrum, where $V_{xx}$ represents the second emission peak, with the same line form of V, but displaced to lower energies. The respective amplitudes A. and A, show respectively a linear dependency ($I \propto I_0$) and a quadratic dependency ($I \propto I_0^{2.2}$) on the excitation fluence. The latter fact demonstrates that the red band is due to a biexciton transition (FIG. 2C). The difference in energy between the peak positions gives a biexciton bond energy of about $E_b^{xx}=30$ meV. Theoretical predictions calculate that two-dimensional heavy-hole biexciton and exciton have a ratio of $E_b^{xx}/E_b^x=0.228$. Using $E_b^x=132\pm20$ meV, $E_b^{xx}=30\pm5$ meV is obtained, this being significantly closer to the experimental value. A calculation using the bulk value of CdSe $E_b^x$ of 15 meV predicts a two-dimensional bond energy of 14 meV. Similar increases compared to the ideal two-dimensional example were observed in auto-assembled CdSe Qdots formed by Cd-rich regions inside a CdZnSe Qwell, where $E_b^{xx}$ was respectively equal to 19-26 meV and 38 meV. The biexciton bond energy again suggests the presence of a residual confinement in the plane of the mass centre; however, more significantly, this data predicts that this is of benefit for the purposes of the present invention since the biexcitons in the CdSe CQwells are stable at room temperature.

The CdSe CQwells have a band limit transition with a so-called giant oscillator strength, in which a coherent phase-shift of dipoles in many unitary cells determines a dipole matrix element bigger than that which can be obtained with a single atom. This is shown by the rapid single exciton PL decay kinetics which can be seen in FIG. 2D. By fitting a multi-exponential function onto the spectrally integrated exciton decay curve an effective average lifetime $\tau_x=438$ ps, together with a smaller intensity tail with a decay constant of 5.1 ns, are obtained. The path of the PL line with greater excitation fluence gives a slightly shorter decay time $\tau_2=296$ ps, with a tail of 1.4 ns. Considering the decay times of the ps and using the respective areas of the exciton and biexciton emissions shown in FIG. 2B, it is possible to estimate an average biexciton lifetime $\tau_{xx}=(\tau_2-A_x\tau_x)/A_{xx}=124$ ps. The ratio $\tau_{xx}/\tau_x$ of 1:3.5 is similar to that of epitaxial systems based on CdSe [15] or GaAs [16], and considering that the typical ratios $\tau_{xx}/\tau_x$ between the decay times for CQdots of type I are close to 1:100 [4], this excludes the possibility that the biexciton average lifetime is dominated by the non-radiative AR. This is supported by a recent study which found average Auger lifetimes of up to 10 ns [17], i.e. at least two orders of magnitude greater than the average radiative liftimes measured.

The SE was initially investigated using excitation with pulses of the order of femtoseconds (fs). FIG. 3A shows a camera streak image of the SE collected at 90° by a focussed strip. The characteristic band narrowing produces an amplitude of the SE peak equal to 6 nm. The ultrarapid decay time falls within the 10 ps response time of the streak camera and clearly indicates that the peak is due to SE. It is also clear from FIG. 3A and from the intensity spectra of FIG. 3B that the SE originates in the energy position of the biexciton transition. The integrated SE shows a clear threshold behaviour where the biexciton PL becomes SE at an ultra-low threshold of 6 μJ/cm$^2$, i.e. about 25 times smaller than in CdSe/Cd$_{0.5}$Zn$_{0.5}$S core/shell systems [4] and CdSe/CdS dot-in-rods with similar emission wavelengths [9].

The inventors have thus obtained a material with various unique properties which are fundamental for low-threshold laser generation. Compared to zero-dimensional CQdots, CQwells have a greater oscillator strength and therefore greater SE and spontaneous emission cross-sections. Owing to the substantial planarity at an atomic level of the CQwells, nearly all the NCs may contribute to the population inversion and losses due to the heterogeneity of the sample are avoided. This is also demonstrated by the PL excitation spectroscopy where both the band limit absorbance and the PLE peak have similar line widths of 34.8±0.5 meV and 33.8±0.4 meV, respectively. The high biexciton bond energy also determines a biexciton emission greatly displaced towards red, this furthermore avoiding linear absorption losses. In this connection, the absence of Auger recombination indicates that the non-linear non-radiative losses are also minimized. Finally, also at room temperature, the gain may originate from a biexciton population while in other quantum well systems at these temperatures the gain is typically obtained by an electron-hole plasma [18]. The four-level system obtained according to the invention represents a more effective configuration for obtaining low-threshold laser generation [18].

Considering now continuous-wave pumped excitation ($\lambda$=444 nm), an SE peak with consistent spectral position and band narrowing is observed (FIG. 3D) as for fs excitation. A continuous-wave SE threshold of 6.5 W/cm$^2$ was found, which value may be obtained using low power continuous-wave excitation sources such as laser or blue emission diodes. Using the variable stripe length method (VSL) [19], modal gain values of $g_{cw}=121\pm1$ cm$^{-1}$ and $g_{fs}=521\pm50$ cm$^{-1}$ for the thin films of CQwell were determined. The gain $g_{cw}$ less than $g_{fs}$ is the result of the smaller excitonic population supported in continuous-wave conditions, as confirmed by the absence of a clear biexcitonic emission before the start of the SE in FIG. 3C. This is probably due to a greater non-radiative AR and more intense exciton/biexciton dissociation kinetics compared to fs excitation. However, in these conditions also $g_{cw}$ is comparable to the fs pulse excited gain in the CQdots [3, 4] and typical gain values in organic materials [20].

The inventors have therefore developed a laser device comprising, as gain medium, a film based on the two-dimensional colloidal nanocrystals described above. More specifically, this laser device has been made by including a film of CdSe CQwells with a thickness of 40 μm, deposited by means of drop casting, in an optical cavity constructed using two Bragg reflectors (BM). The BMs have a photonic gap which overlaps the emission peak of 530 nm of the CQwells. As for SE, a near-instantaneous response of the laser peak was measured using the method of excitation with pulses having a duration of fs (FIG. 4B). In the same position a spectral narrowing in continuous-wave conditions was observed (FIG. 4C). Furthermore, the peak increases in a superlinear manner with the excitation power (FIG. 4D). Both the characteristics are characteristic signs of the fact that the cavity has reached the laser action. The threshold of 60 mW, corresponding to a power density of 328 W/cm$^2$, places the required excitation density well within the range of existing blue light sources. The laser peak observed is a laser mode envelope.

By varying the process parameters described above, the inventors have also realized samples of tightly packed colloidal CdSe Cqwell films without confinement in the directions of the plane of the two-dimensional crystals (the crystals described with reference to FIG. 1A instead have a weak confinement in a lateral direction, y, and almost no confinement in the other lateral direction, x). As can be seen in FIG. 5A, these crystals have lateral dimensions (in two arbitrary, mutually orthogonal, lateral directions, x and y) equal to about 20-30 nm. As can be seen in FIGS. 5B-5D, these nanocrystals without lateral confinement demonstrated the formation of a continuous-wave stimulated wave emission (i.e. the prerequisite for laser action) in a manner entirely similar to that of the crystals shown in FIG. 1A.

On the basis of the results indicated above it may be concluded that similar results may be obtained with nanocrystals which have weak confinement in both the direction x and y.

To conclude, the inventors have shown that CdSe colloidal quantum wells have many characteristics in common with epitaxial systems, making them suitable as high gain materials. It is considered that similar results may be obtained with nanocrystals of different semiconductor materials, in particular of type II-VI. Precise control of the lateral dimensions of the nanocrystals in colloidal synthesis allows exceptionally high excitonic—and in particular biexcitonic—bond energies to be achieved. The suspended quantum wells are easily produced by means of wet chemical methods. As described above, a 530 nm continuous-wave pumped laser was obtained using a simple layer of gain medium deposited by means of drop casting. This leaves ample space for optimization of the material and the devices, for example in the form of core/shell CQwells [21] and in the single mode cavity direction. Considering the broad lateral dimensions, CQwell systems could constitute a step forwards also towards the realization of electrically injected solution-processed lasers.

Bibliography
1. Grivas, C. & Pollnau, M. Organic solid-state integrated amplifiers and lasers. *Laser Photon. Rev.* 6, 419-462 (2012).
2. Clark, J. & Lanzani, G. Organic photonic for communications. *Nat. Photonics* 4, 438-446 (2010).
3. Klimov, V. I. Optical Gain and Stimulated Emission in Nanocrystal Quantum Dots. *Science (80-.).* 290, 314-317 (2000).
4. Dang, C. et al. Red, green and blue lasing enabled by single-exciton gain in colloidal quantum dot films. *Nat. Nanotechnol.* 7, 335-9 (2012).
5. Grivas, C, et al. Single-mode tunable laser emission in the single-exciton regime from colloidal nanocrystals. *Nat. Commun.* 4, 2376 (2013).
6. Klimov, V. I. Quantization of Multiparticle Auger Rates in Semiconductor Quantum Dots. *Science (80-.).* 287, 1011-1013 (2000).
7. Garcia-Santamaria, F. et al. Suppressed auger recombination in "giant" nanocrystals boosts optical gain performance. *Nano Lett.* 9, 3482-8 (2009).
8. Zavelani-Rossi, M. et al. Suppression of biexciton auger recombination in CdSe/CdS dot/rods: role of the electronic structure in the carrier dynamics. *Nano Lett.* 10, 3142-50 (2010).
9. Moreels, I. et al. Nearly temperature-independent threshold for amplified spontaneous emission in colloidal CdSe/CdS quantum dot-in-rods. *Adv. Mater.* 24, OP231-5 (2012).
10. Climente, J. I. et al. Auger recombination suppression in nano crystals with asymmetric electron-hole confinement. *Small* 8, 754-9 (2012).
11. Bae, W. K. et al. Controlled alloying of the core-shell interface in CdSe/CdS quantum dots for suppression of Auger recombination. *ACS Nano* 7, 3411-9 (2013).
12. Achtstein, A. W. et al. Electronic structure and exciton-phonon interaction in two-dimensional colloidal CdSe nanosheets. *Nano Lett.* 12, 3151-7 (2012).
13. Ithurria, S. et al. Colloidal nanoplatelets with two-dimensional electronic structure. *Nat. Mater.* 10, 936-41 (2011).
14. Voigt, J. et al. Band parameters of CdS and CdSe single crystals determined from optical exciton spectra. *Phys. Status Solidi* 91, 189-199 (1979).
15. Woggon, U. et al. Huge binding energy of localized biexcitons in CdS/ZnS quantum structures. *Phys. Rev. B* 61, 12632-12635 (2000).
16. Kim, J. et al. Thermodynamics of biexcitons in a GaAs quantum well. *Phys. Rev. B* 50, 15099-15107 (1994).
17. Kunneman, L. T. et al. Bimolecular Auger Recombination of Electron-Hole Pairs in Two-Dimensional CdSe and CdSe/CdZnS Core/Shell Nanoplatelets. *J. Phys. Chem. Lett.* 4, 3574-3578 (2013).
18. Homburg, O. et al. Biexcitonic gain characteristics in ZnSe-based lasers with binary wells. *Phys. Rev. B* 60, 5743-5750 (1999).
19. Malko, A. V. et al. From amplified spontaneous emission to microring lasing using nanocrystal quantum dot solids. *Appl. Phys. Lett.* 81, 1303 (2002).
20. Chenais, B. et al. Recent advances in solid-state organic lasers. *Polym. Int.* 61, 390-406 (2012).
21. Mahler, B. et al. Core/shell colloidal semiconductor nanoplatelets. *J. Am. Chem. Soc.* 134, 18591-8 (2012).

The invention claimed is:
1. Laser device comprising a film of colloidal nanocrystals of semiconductor material as a gain medium, wherein said nanocrystals are two-dimensional nanocrystals forming quantum wells for confinement of charge carriers in the nanocrystals and having a biexciton gain mechanism, the device being characterized in that said nanocrystals are adapted to provide strong confinement of the charge carriers in a thickness direction (z) of the nanocrystal and weak or no confinement of the charge carriers in each of two mutually orthogonal lateral directions (x, y) of the nanocrystal, orthogonal to the thickness direction (z).

2. Device according to claim 1, wherein the nanocrystals have a thickness comprised in the range of 1-5 nm.

3. Device according to claim 1, wherein the nanocrystals have a core/shell structure comprising a core part and a shell part of different semiconductor materials, wherein the core part has a thickness comprised in the range of 1-5 nm.

4. Device according to claim 1, wherein the nanocrystals are of semiconductor selected from the group consisting of selenides, sulphides and tellurides of elements of groups I, II, III, IV and V, and their core/shell structures.

5. Device according to claim 4, wherein the nanocrystals further contain atomic dopants in a concentration of less than 10%.

6. Device according to claim 1, wherein the film of colloidal two-dimensional nanocrystals is arranged in a resonant cavity having a photonic gap which overlaps the emission peak of the colloidal two-dimensional nanocrystals.

7. Device according to claim 1, further comprising a continuous-wave optical pumping source.

8. Device according to claim 1, further comprising a pulsed optical pumping source.

\* \* \* \* \*